(12) United States Patent
Kaibara et al.

(10) Patent No.: US 8,748,995 B2
(45) Date of Patent: Jun. 10, 2014

(54) NITRIDE SEMICONDUCTOR DEVICE WITH METAL LAYER FORMED ON ACTIVE REGION AND COUPLED WITH ELECTRODE INTERCONNECT

(71) Applicant: Panasonic Corporation, Kadoma (JP)

(72) Inventors: Kazuhiro Kaibara, Toyama (JP); Hidetoshi Ishida, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/733,827

(22) Filed: Jan. 3, 2013

(65) Prior Publication Data

US 2013/0119486 A1    May 16, 2013

Related U.S. Application Data

(63) Continuation of application No. PCT/JP2011/002361, filed on Apr. 22, 2011.

(30) Foreign Application Priority Data

Jul. 12, 2010    (JP) .................................. 2010-157574

(51) Int. Cl.
    *H01L 29/78*    (2006.01)
(52) U.S. Cl.
    USPC ........................................................ 257/411
(58) Field of Classification Search
    CPC . H01L 29/78; H01L 23/4824; H01L 27/0605; H01L 29/2003; H01L 29/42312; H01L 29/7787; H01L 29/41758
    USPC ........................................................ 257/411
    See application file for complete search history.

(56) References Cited

U.S. PATENT DOCUMENTS

| 4,972,237 | A  | 11/1990 | Kawai |
| 6,268,632 | B1 | 7/2001  | Sugimura et al. |
| 7,550,821 | B2 | 6/2009  | Shibata et al. |
| 2005/0116253 | A1 | 6/2005 | Yamane et al. |
| 2005/0189561 | A1 | 9/2005 | Kinzer et al. |

(Continued)

FOREIGN PATENT DOCUMENTS

| JP | 63-073648 A | 4/1988 |
| JP | 2-268467 A | 11/1990 |

(Continued)

OTHER PUBLICATIONS

Yuji Ando et al., "Evolution of High Breakdown Voltage AlGaN/GaN Heterojuction FET", IEICE Technical Report, ED2002-214, CPM2002-105 (Oct. 2002), p. 29-34.

(Continued)

*Primary Examiner* — Walter H Swanson
(74) *Attorney, Agent, or Firm* — McDermott Will & Emery LLP

(57) ABSTRACT

A nitride semiconductor device includes a nitride semiconductor multilayer including an active region, and first and second electrodes, each having a finger-like structure and formed on the active region to be spaced from each other. A first electrode interconnect is formed on the first electrode. A second electrode interconnect is formed on the second electrode. A second insulating film is formed to cover the first and second electrode interconnects. A first metal layer is formed on the second insulating film. The first metal layer is formed above the active region with the second insulating film interposed therebetween, and is coupled to the first electrode interconnect.

14 Claims, 7 Drawing Sheets

(56) References Cited

U.S. PATENT DOCUMENTS

| | | |
|---|---|---|
| 2005/0274977 A1 | 12/2005 | Saito et al. |
| 2006/0043415 A1 | 3/2006 | Okamoto et al. |
| 2006/0081985 A1 | 4/2006 | Beach et al. |
| 2006/0145283 A1 | 7/2006 | Zhu et al. |
| 2007/0046379 A1 | 3/2007 | Tanahashi et al. |
| 2008/0073671 A1 | 3/2008 | Yamane et al. |
| 2008/0149940 A1 | 6/2008 | Shibata et al. |
| 2010/0213503 A1 | 8/2010 | Yanagihara et al. |
| 2010/0237049 A1 | 9/2010 | Mokadem |
| 2011/0031533 A1 | 2/2011 | Yamane et al. |

FOREIGN PATENT DOCUMENTS

| | | |
|---|---|---|
| JP | H02-268467 A | 11/1990 |
| JP | 06-005849 A | 1/1994 |
| JP | 06-163604 A | 6/1994 |
| JP | 06-326201 A | 11/1994 |
| JP | 7-094481 | 4/1995 |
| JP | H07-094481 H | 4/1995 |
| JP | 08-008441 A | 1/1996 |
| JP | 2000-049169 A | 2/2000 |
| JP | 2001-203267 A | 7/2001 |
| JP | 2001-284992 A | 10/2001 |
| JP | 2004-273658 A | 9/2004 |
| JP | 2004-363563 A | 12/2004 |
| JP | 2008-177527 A | 7/2008 |
| WO | 8502061 A1 | 5/1985 |

OTHER PUBLICATIONS

International Search Report issued in International Application No. PCT/JP2011/002361 mailed on Aug. 2, 2011.

Office Action issued in corresponding U.S. Appl. No. 13/689,397, mailed Jul. 2, 2013.

NITRIDE SEMICONDUCTOR DEVICE WITH METAL LAYER FORMED ON ACTIVE REGION AND COUPLED WITH ELECTRODE INTERCONNECT

CROSS-REFERENCE TO RELATED APPLICATION

This is a continuation of International Application No. PCT/JP2011/002361 filed on Apr. 22, 2011, which claims priority to Japanese Patent Application No. 2010-157574 filed on Jul. 12, 2010. The entire disclosures of these applications are incorporated by reference herein.

BACKGROUND

The present disclosure relates to nitride semiconductor devices, and more particularly to nitride semiconductor devices including electrode pads above an active region.

Group III-V nitride semiconductor (hereinafter referred to as nitride semiconductor) is a compound of group III elements such as gallium (Ga), aluminum (Al), and indium (In), and a group V element, nitrogen (N), and forms an alloy represented by the general formula $Al_xGa_{1-x-y}In_yN$, where $0 \leq x \leq 1$, $0 \leq y \leq 1$, and $x+y \leq 1$. Nitride semiconductor has a wide band gap and a direct transition band structure, and is thus applied to short-wavelength optical devices. Applying nitride semiconductor to electronic devices is also considered, since it has a high breakdown voltage and high electron saturation velocity as its characteristics. In particular, heterojunction field effect transistors (hereinafter referred to as HFETs) utilizing two-dimensional electron gas (hereinafter referred to as 2DEG) generated at the interface between an $Al_xGa_{1-x}N$ layer, where $0<x \leq 1$, and a GaN layer, which are sequentially formed by epitaxial growth on a semi-insulating substrate, are being developed as high output devices and high frequency devices.

In HFETs, not only electrons are supplied from an AlGaN Schottky layer, which is a carrier supply layer, but also charges are supplied by a polarization effect caused by spontaneous polarization and piezoelectric polarization. HFETs made of nitride semiconductor have an electron density higher than $10^{13}$ cm$^{-2}$, which is higher than HFETs made of aluminum gallium arsenide (AlGaAs) and gallium arsenide (GaAs) by about one digit. As such, HFETs made of nitride semiconductor are expected to have a higher drain current density than HFETs made of GaAs. An element having a maximum drain current larger than 1 A/mm is reported. (See, for example, Yuji Ando, Yasuhiro Okamoto, Hironobu Miyamoto, Tatsuo Nakayama, Takashi Inoue, Masaaki Kuzuhara, Evaluation of High Breakdown Voltage AlGaN/GaN Heterojunction FET, IEICE Technical Report, ED2002-214, CPM2002-105 (2002-10), p. 29-34.) Furthermore, nitride semiconductor has a wide band gap (for example, GaN has a band gap of 3.4 eV) to exhibit high breakdown voltage characteristics. HFETs made of nitride semiconductor has a breakdown voltage of 100 V or more between a gate electrode and a drain electrode. Therefore, applying electronic devices made of nitride semiconductor such as HFETs as high frequency elements and elements handling greater power with a smaller size than conventional devices is considered.

Nitride semiconductor devices have active regions of about 1/3-1/10 the sizes of active regions in silicon (Si) semiconductor devices. However, when a nitride semiconductor device is used as a power device in which a large current flows, the sizes of wires and ribbons coupled to electrode pads are preferably large. Even if an active region is reduced, it is less effective in reducing the size of the nitride semiconductor device. In order to reduce the size of a nitride semiconductor device, what is called a pad-on-element structure in which electrode pads are formed on an active region is considered. (See, for example, Japanese Patent Publication No. 2008-177527.)

SUMMARY

However, the conventional pad-on-element structure has the following problems. Pads can be arranged most efficiently by forming drain electrode pads on the active layer, and forming source electrode pads on the back surface of a substrate. However, in order to form the source electrode pads on the back surface of the substrate, it is necessary to form vias penetrating a nitride semiconductor layer and the substrate, thereby increasing the costs. Thus, in view of the facility in a manufacturing method and reduction in the size, the drain electrode pads and the source electrode pads are preferably formed on the active layer. However, where both of the drain electrode pads and the source electrode pads are formed on the active layer, only part of electrode fingers can be in direct contact with the electrode pads. The width of the electrode fingers is limited by the size of the device, and thus is difficult to increase. In addition, electrode fingers are generally formed by lift-off and it thus difficult to reduce the thickness of the electrode fingers. Thus, where the electrode fingers have great interconnection resistance, and only part of the electrode fingers are in direct contact with the electrode pads, the on-resistance of the device increases.

Where one type of the electrode pads are formed on the active layer, it is necessary to form a large opening so that the entire electrode fingers are in direct contact with the electrode pads, thereby degrading the flatness of the electrode pads.

These problems occur not only in HFETs but also in other nitride semiconductor devices such as Schottky diodes.

It is an objective of the present disclosure to solve the problems in forming electrode pads on an active layer, and to provide a nitride semiconductor device in which a rise in on-resistance is reduced.

In order to achieve the objective, the present disclosure provides a semiconductor device in which electrode pads formed above an active region are coupled to electrodes via electrode interconnects.

Specifically, an example nitride semiconductor device includes a nitride semiconductor multilayer formed on a substrate, and including an active region surrounded by an isolation region; a first electrode and a second electrode, each having a finger-like structure and formed above the active region to be spaced apart from each other; a first insulating film covering the first and second electrodes, and having a first opening exposing an upper surface of the first electrode, and a second opening exposing an upper surface of the second electrode; a first electrode interconnect formed on the first electrode in contact with the first electrode in the first opening; a second electrode interconnect formed on the second electrode in contact with the second electrode in the second opening; a second insulating film covering the first and second electrode interconnects; and a first metal layer formed above the active region with the second insulating film interposed therebetween, and coupled to the first electrode interconnect.

In the example nitride semiconductor device, the first metal layer, which is an electrode pad, is formed above the active region with the second insulating film interposed therebetween, and is coupled to the first electrode interconnect. Where the first metal layer formed above the active region is directly coupled to the first electrode by vias etc., the on-resistance of the nitride semiconductor device may rise, since the first electrode has great interconnection resistance. However, in the example device, the first metal layer is coupled to the first electrode via the first electrode interconnect. Since the first electrode interconnect has smaller interconnection resistance than the first electrode, a rise in the on-resistance of the nitride semiconductor device can be reduced, even if the first metal layer is in contact with the first electrode interconnect in a small area.

The example nitride semiconductor device may further include a second metal layer formed above the second insulating film to be spaced apart from the first metal layer. The second metal layer may be formed above the active region, and may be coupled to the second electrode interconnect.

The example nitride semiconductor device may further include a first via configured to couple the first metal layer to the first electrode interconnect; and a second via configured to couple the second metal layer to the second electrode interconnect. The first and second vias may be formed above the active region. Alternatively, the example nitride semiconductor device may further include a first via configured to couple the first metal layer to the first electrode interconnect; and a second via configured to couple the second metal layer to the second electrode interconnect. The first and second vias may be formed above the isolation region.

In this case, the second insulating film may include a first film being a silicon nitride film or a silicon oxide film, and a second film being an organic insulating film formed on the first film. Each of openings of the first and second vias may have a larger area at a lower end of the second film than at an upper end of the first film.

In the example nitride semiconductor device, a product of a breakdown voltage of the second insulating film and the shortest one of a minimum distance between the first and second electrode interconnects, a minimum distance between the first electrode interconnect and the second metal layer, or a minimum distance between the second electrode interconnect and first metal layer is preferably 600 V or higher.

In the example nitride semiconductor device, the first electrode may be a cathode electrode. The second electrode may be an anode electrode.

The example nitride semiconductor device may further include a first gate electrode having a finger-like structure, and formed between the first and second electrodes; and a third metal layer formed on the second insulating film to be spaced apart from the first and second metal layers, and coupled to the first gate electrode. A distance between the third and second metal layers may be greater than or equal to a distance between the third and first metal layers. The first electrode may be a source electrode. The second electrode may be a drain electrode.

In this case, in a cross-section perpendicular to the substrate, and perpendicularly crossing the first and second electrode interconnects, an end of the first electrode interconnect close to the second electrode may be located closer to the second electrode than the first gate electrode.

The example nitride semiconductor device may further include a p-type nitride semiconductor layer formed between the first gate electrode and the nitride semiconductor multilayer.

The example nitride semiconductor device may further include a first gate electrode and a second gate electrode, each having a finger-like structure and sequentially formed above the first electrode between the first and second electrodes; and a third metal layer and a fourth metal layer formed on the second insulating film to be spaced apart from the first and second metal layers, and coupled to the first and second gate electrodes, respectively. A distance between the third and second metal layers may be greater than or equal to a distance between the third and first metal layers. The first electrode may be a first ohmic electrode. The second electrode may be a second ohmic electrode.

In this case, in a cross-section perpendicular to the substrate, and perpendicularly crossing the first and second electrode interconnects, an end of the first electrode interconnect close to the second electrode may be located closer to the second electrode than the first gate electrode, and closer to the first gate electrode than the second gate electrode, and an end of the second electrode interconnect close to the first electrode is closer to the first electrode than the second gate electrode, and closer to the second gate electrode than the first gate electrode.

The example nitride semiconductor device may further include a p-type nitride semiconductor layer formed between the first and second gate electrodes and the nitride semiconductor multilayer.

The present disclosure solves the problems occurring in forming electrode pads on an active layer, and provides a nitride semiconductor device in which a rise in on-resistance is reduced.

DETAILED DESCRIPTION

Figure 1:
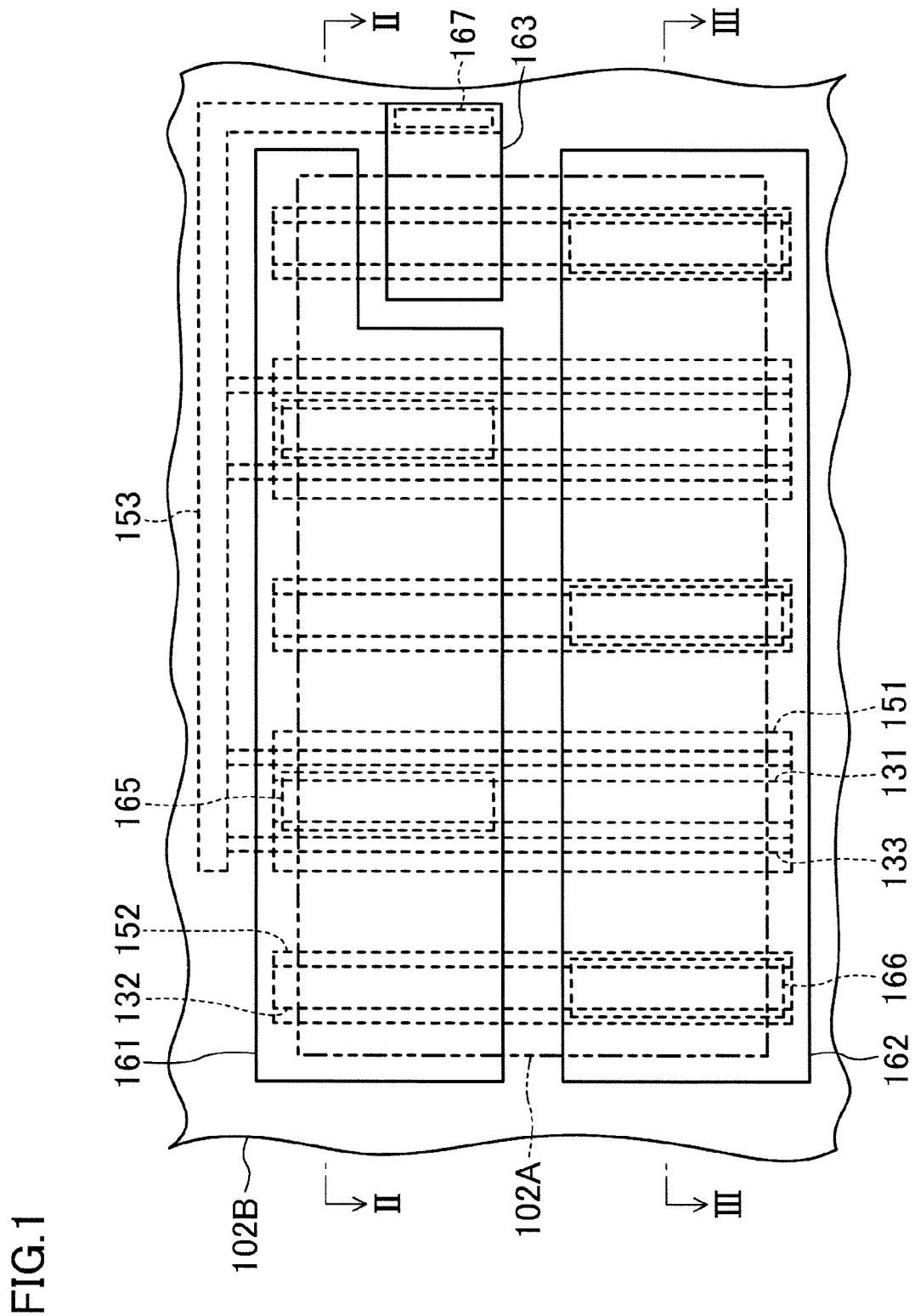
FIG. 1 is a top view of a nitride semiconductor device according to an embodiment.
Figure 2:
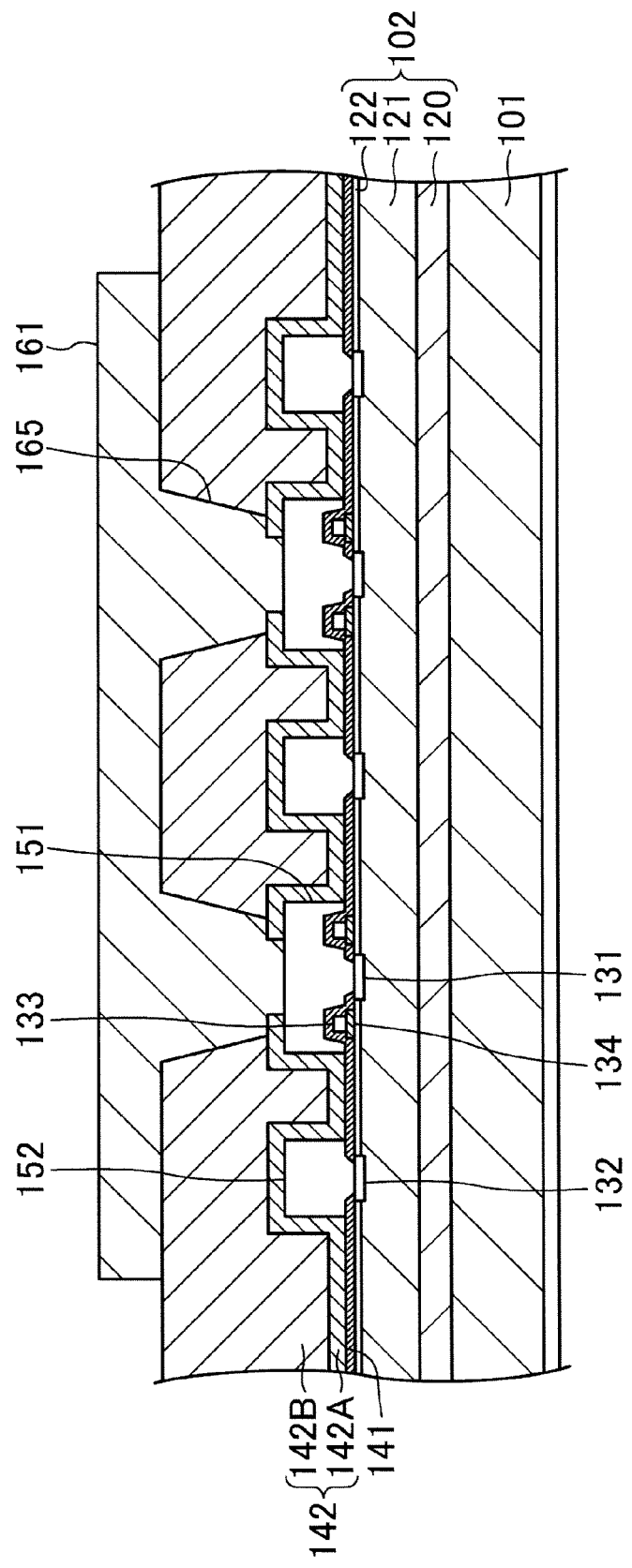
FIG. 2 is a cross-sectional view of the nitride semiconductor device according to the embodiment.
Figure 3:
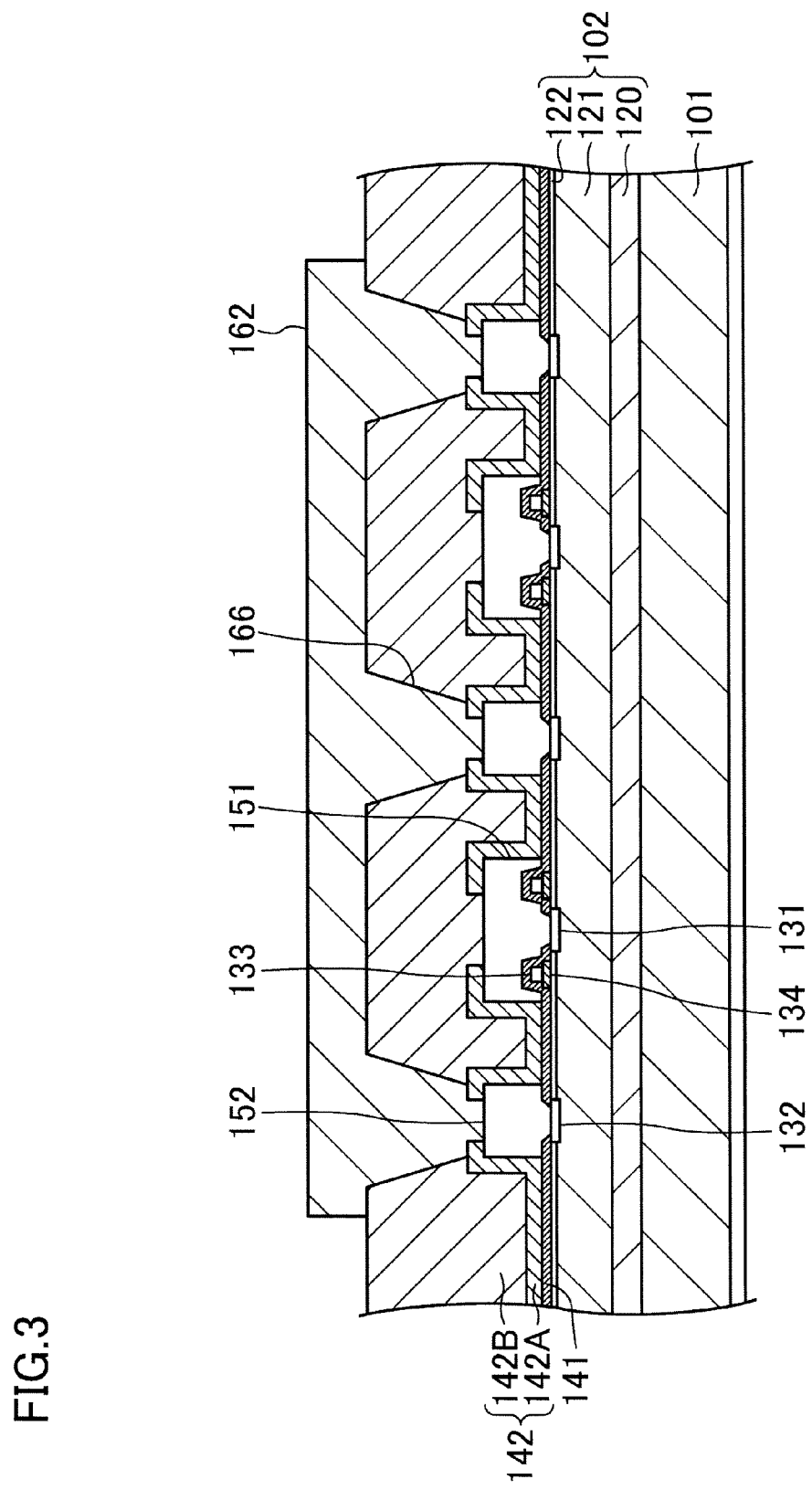
FIG. 3 is a cross-sectional view of the nitride semiconductor device according to the embodiment.

FIGS. 1-3 illustrate a nitride semiconductor device according to an embodiment. FIG. 1 is a top view. FIG. 2 is a cross-sectional view taken along the line II-II of FIG. 1. FIG. 3 is a cross-sectional view taken along the line of FIG. 1. The nitride semiconductor device according this embodiment includes a nitride semiconductor multilayer 102 formed on a Si substrate 101. The nitride semiconductor multilayer 102 includes, for example, a buffer layer 120, a first nitride semiconductor layer 121 having a thickness of 2.5 μm and made of undoped GaN, and a second nitride semiconductor layer 122 having a thickness of 50 nm and made of undoped AlGaN, which are sequentially formed on the substrate 101. The nitride semiconductor multilayer 102 includes an active region 102A, and the isolation region 102B surrounding the active region 102A. The resistance of the isolation region 102B is increased by ion implantation etc. In the active region 102A, a channel made of two-dimensional electron gas (2DEG) is formed in the first nitride semiconductor layer 121 near the boundary between the first nitride semiconductor layer 121 and the second nitride semiconductor layer 122.

First and second finger-like ohmic electrodes 131 and 132 are alternately spaced apart from each other on the nitride semiconductor multilayer 102 across the active region 102A.

A gate electrode 133 is interposed between each pair of the first ohmic electrodes 131 and the second ohmic electrodes 132, and is formed on a p-type third nitride semiconductor layer 134. In this embodiment, the first ohmic electrodes 131 are source electrodes, and the second ohmic electrodes 132 are drain electrodes. While FIG. 1 illustrates the two first ohmic electrodes 131 and the three second ohmic electrodes 132, any numbers of the first ohmic electrodes 131 and the second ohmic electrodes 132 may be provided.

The first ohmic electrodes 131 and the second ohmic electrodes 132 are made of titanium (Ti) and aluminum (Al), and are in ohmic contact with the channel. In this embodiment, in order to reduce contact resistance, the first ohmic electrodes 131 and the second ohmic electrodes 132 are formed in recesses reaching below the boundary between the second nitride semiconductor layer 122 and the first nitride semiconductor layer 121. Each of the first ohmic electrodes 131 and the second ohmic electrodes 132 has a maximum thickness of about 250 nm, and a width of about several μm. The interconnection resistance of the ohmic electrodes can be reduced by increasing the width. However, the width is not preferably increased, since the ratio of a channel region to the area of a chip deceases. With an increase in the channel region, on-resistance decreases, thereby allowing a large current to flow. Thus, the channel region is preferably large. The first ohmic electrodes 131 and the second ohmic electrodes 132 may be made of nickel (Ni), gold (Au), vanadium (V), etc. The first ohmic electrodes 131 and the second ohmic electrodes 132 are easily formed by lift-off.

Each of the p-type third nitride semiconductor layers 134 has a thickness of about 200 nm and made of magnesium (Mg) doped with GaN. Each of the gate electrodes 133 is made of palladium (Pd) and Au, and in ohmic contact with the corresponding p-type third nitride semiconductor layer 134. The p-type third nitride semiconductor layer 134 and the second nitride semiconductor layer 122 form a PN junction. As a result, even if the voltage applied to the gate electrodes 133 is 0 V, a depletion layer expands in the second nitride semiconductor layer 122 and the first nitride semiconductor layer 121 from the p-type third nitride semiconductor layer 134 to the substrate 101 and the second ohmic electrodes 132. Thus, even if the voltage applied to the gate electrodes 133 is 0 V, normally-off operation is performed, in which a current flowing to the channel is cut off. In this embodiment, the p-type third nitride semiconductor layer 134 and the gate electrodes 133 are formed in a gate recess (not shown) in which the second nitride semiconductor layer 122 has a smaller thickness than the other portion to control the threshold voltage. The gate electrodes 133 may be made of Ni, Ti, silver (Ag), platinum (Pt), etc. While the normally-off type semiconductor device is provided using the p-type third nitride semiconductor layer 134, the normally-off type semiconductor device may be provided by a gate recess structure etc. The semiconductor device may be of a normally-on type.

A first insulating film 141, which is a silicon nitride film (SiN film) with a thickness of about 300 nm is formed on the nitride semiconductor multilayer 102 to cover the first ohmic electrodes 131, the second ohmic electrodes 132, and the gate electrodes 133. The first insulating film 141 have the functions of stabilizing the surface of the nitride semiconductor multilayer 102 and reducing water permeating the nitride semiconductor multilayer 102 from a second insulating film 142, which will be described below. The first insulating film 141 has first stripe-pattern openings exposing the upper surfaces of the first ohmic electrodes 131, and second stripe-pattern openings exposing the upper surfaces of the second ohmic electrodes 132.

First ohmic electrode interconnects 151 and second ohmic electrode interconnects 152 are formed on the first insulating film 141. The first ohmic electrode interconnects 151 are coupled to the first ohmic electrodes 131 in the first openings. The second ohmic electrode interconnects 152 are coupled to the second ohmic electrodes 132 in the second openings. The first ohmic electrode interconnects 151 and the second ohmic electrode interconnects 152 are multilayer films of Ti and Au. The Ti layer is an adhesion layer for improving adhesiveness between each pair of the first ohmic electrodes 131 and the second ohmic electrodes 132. Each of the first ohmic electrode interconnects 151 and the second ohmic electrode interconnects 152 may have a thickness of about 5 μm, and a width greater than or equal to those of the first ohmic electrodes 131 and the second ohmic electrodes 132.

The second insulating film 142 is formed to cover the first ohmic electrode interconnects 151 and the second ohmic electrode interconnects 152. In this embodiment, the second insulating film 142 is a multilayer film of a first film 142A having a thickness of about 400 nm and made of SiN, and a second film 142B having a thickness of about 10 μm and made of polybenzoxazole (PBO). The first film 142A has the functions of reducing water permeating the nitride semiconductor multilayer 102 from the second film 142B, and improving the adhesiveness between the second film 142B and the underlying layer.

A first metal layer 161, a second metal layer 162, and a third metal layer 163, which are electrode pads, are formed on the second insulating film 142. In this embodiment, the first metal layer 161 and the second metal layer 162 are formed above the active region 102A. The first metal layer 161 and the second metal layer 162 are spaced apart from each other so that sides intersecting with the direction (i.e., a gate width direction), in which the gate electrodes 133 extend, are located in facing positions. The second insulating film 142 includes third openings exposing the upper surfaces of the first ohmic electrode interconnects 151 under the first metal layer 161. First vias 165 integrated with the first metal layer 161 are formed to fill the third openings, and couple the first metal layer 161 to the first ohmic electrode interconnects 151. The second insulating film 142 also includes second openings exposing the upper surfaces of the second ohmic electrode interconnects 152 under the second metal layer 162. Second vias 166 integrated with the second metal layer 162 are formed to fill the second openings, and couple the second metal layer 162 to the second ohmic electrode interconnects 152.

The first metal layer 161, the second metal layer 162, and the third metal layer 163 may be multilayer films of Ti, copper (Cu), and Ni. The Cu film preferably has a thickness of about 5 μm to reduce sheet resistance. By using the Ni film as the uppermost layer, adhesiveness with Al wires, Al ribbons, etc. improves, thereby providing a highly reliable semiconductor device. The Ni film preferably has a thickness of about 1 μm. Ag may be used instead of Ni. Where wires, ribbons, clips, etc. made of Au, Cu, etc. are used, the uppermost layer may be an Au layer.

In this embodiment, the third metal layer 163 is formed in a region closer to the first metal layer 161 above the active region 102A. This configuration secures the breakdown voltage between the third metal layer 163 and the second metal layer 162, and reduces the size of semiconductor device. The third metal layer 163 is coupled to a gate electrode interconnect 153 formed above the isolation region 102B via a third via 167. The gate electrode interconnect 153 is provided to skirt the portion above the active region 102A and coupled to the gate electrodes 133. In this embodiment, the first ohmic electrode interconnects 151 and the second ohmic electrode interconnects 152 are not drawn to the isolation region 102B for coupling. Thus, the gate electrode interconnect 153 does not cross the first ohmic electrode interconnects 151 and the second ohmic electrode interconnects 152. Where a plurality of active regions are formed, a gate electrode interconnect may be formed to bind a plurality of gate electrodes in an isolation region between adjacent ones of the active regions.

Where the first metal layer 161 and the second metal layer 162 are formed above the active region 102A, part of the first ohmic electrodes 131 is located below the second metal layer 162, and part of the second ohmic electrodes 132 is located below the first metal layer 161. If the first ohmic electrode interconnects 151 are not formed, and the first metal layer 161 is directly coupled to the first ohmic electrodes 131 via vias, only the portions of the first ohmic electrodes 131 formed below the first metal layer 161 are in contact with the vias. The first ohmic electrodes 131 have a small thickness and a small width, and thus have great interconnection resistance. Thus, in the portions of the first ohmic electrodes 131 formed below the second metal layer 162, the resistance between the first metal layer 161 and the first ohmic electrodes 131 is not negligible. The same problem occurs between the second metal layer 162 and the second ohmic electrodes 132. The first ohmic electrodes 131 and the second ohmic electrodes 132 are generally formed by lift-off, it is thus difficult to increase the thickness to reduce the interconnection resistance. The width of the first ohmic electrodes 131 and the second ohmic electrodes 132 is limited by the size of the device, it is thus difficult to increase the width to reduce the interconnection resistance.

In the semiconductor device according to this embodiment, the first ohmic electrode interconnects 151 are formed to cover the tops of the first ohmic electrodes 131, and the second ohmic electrode interconnects 152 are formed to cover the tops of the second ohmic electrodes 132. The thickness of the first ohmic electrode interconnects 151 and the second ohmic electrode interconnects 152 can be larger than the thickness of the first ohmic electrodes 131 and the second ohmic electrodes 132, thereby easily reducing the interconnection resistance. Thus, even if vias are coupled to the portions of the first ohmic electrode interconnects 151 under the first metal layer 161, the resistance between the first metal layer 161 and the first ohmic electrodes 131 is reduced. This is also applicable to the resistance between the second metal layer 162 and the second ohmic electrodes 132. The semiconductor device according to this embodiment reduces the interconnection resistance to the half, as compared to the case where the first and second metal layers are directly coupled to the first and second ohmic electrodes not via the first and second ohmic electrode interconnects, respectively.

In order to effectively reduce the interconnection resistance, the cross-sectional areas of the first ohmic electrode interconnects 151 and the second ohmic electrode interconnects 152 in the direction intersecting the gate width direction may be larger than those of the first ohmic electrodes 131 and the second ohmic electrodes 132. Where the first ohmic electrode interconnects 151 and the second ohmic electrode interconnects 152 are formed by plating, the thickness can be easily increased. The first ohmic electrode interconnects 151 and the second ohmic electrode interconnects 152 are preferably made of a material with as small electrical resistance as possible, and may be Au, Cu, an alloy of the materials, etc. Alternatively, the first ohmic electrode interconnects 151 and the second ohmic electrode interconnects 152 may be made of Al, Ni, Ti, an alloy of these materials, etc. The first ohmic electrode interconnects 151 and the second ohmic electrode interconnects 152 may be multilayer films to improve adhesiveness with the first ohmic electrodes 131 and the second ohmic electrodes 132. In this case, the lowest layer, which is an adhesion layer, may be made of Ti, Ta, a nitride of these materials, etc.

FIG. 1 illustrates an example where the first ohmic electrode interconnects 151 are formed to cover the tops of the gate electrodes 133. The first ohmic electrode interconnects 151 extend more than the gate electrodes 133 toward the second ohmic electrodes 132, thereby increasing the cross-sectional areas of the first ohmic electrode interconnects 151, and allowing the first ohmic electrode interconnects 151 to function as field plates. Furthermore, the first metal layer 161 and the second metal layer 162 are formed above the active region 102A. This reduces electric field concentration at the ends of the gate electrodes 133 and the ends of the field plates, which are the first ohmic electrode interconnects 151, in an off state of the semiconductor device. Accordingly, current collapse is reduced, as compared to the case without a pad-on-element structure.

In this embodiment, the second insulating film 142 is a multilayer film of the first film 142A of SiN and the second film 142B of PBO. An organic film such as a PBO film can be formed by spin coating to facilitate filling of recesses, thereby easily making the upper surface of the second insulating film 142 flat. By making the upper surface of the second insulating film 142 flat, a metal layer, which is an electrode pad, and formed above the second insulating film 142, can be flat. By making the electrode pad flat, the contact area between the surface of the electrode pad and a wire increases, thereby reducing the wiring resistance and improving the yield of wire bonding.

PBO have lower adhesiveness with Au. Thus, in order to improve adhesiveness between each pair of the first and second ohmic electrode interconnects 151 and 152, whose uppermost layers are made of Au, and the second insulating film 142; the first film 142A made of SiN is provided between the second film 142B and the first and second ohmic electrode interconnects 151 and 152. The first film 142A may be a $SiO_2$ film etc., but a SiN film has high water resistance and reduces water permeating the underlying layer. The first film 142A may be formed by, for example, chemical vapor deposition (CVD) etc.

Each of the third openings for coupling the first metal layer 161 to the first ohmic electrode interconnects 151, and fourth openings for coupling the second metal layer 162 to the second ohmic electrode interconnects 152 preferably has a greater width at the lower end of the second film 142B than at the upper end of the first film 142A. Thus, each of the first vias 165 and the second vias 166 has a larger area at the lower end of the second film 142B than at the upper end of the first film 142A. This structure prevents the second film 142B having low adhesiveness with Au from coming into a direct contact with the upper surfaces of the first ohmic electrode interconnects 151 and the second ohmic electrode interconnects 152, thereby reducing removal of the second insulating film 142 etc. The openings in the first film 142A may be formed by dry etching. The openings in the second film 142B may be formed by photolithography, where the second film 142B is made of photosensitive resin. The openings in the second film 142B may be formed by dry etching using an $SiO_2$ film etc., as a hard mask.

Instead of PBO, the second film 142B may an organic film made of polyimide, benzocyclobutene (BCB), epoxy photosensitive resin (e.g., SU-8 by MicroChem), or fluorine photosensitive resin (e.g., AL-X2 by Asahi Glass Co., Ltd.), etc. Where a hygroscopic material such as polyimide is used, hygroscopic treatment expands the second film 142B. Then, a crack may occur in the second film 142B, and water may permeate the underlying layer. Therefore, a water-resistant third film is preferably formed on the second film 142B.

Where a material having high adhesiveness with Au such as Al-X2 is used, the first film 142A may be omitted. The first film 142A may be also omitted where the uppermost layers of the first ohmic electrode interconnects 151 and the second ohmic electrode interconnects 152 are made of a material having relatively high adhesiveness with an organic film of Ti, Cu, etc.

The second film 142B may be made of a glass material. In this case, the material may include phosphorus. This reduces the film stress of the second insulating film 142, thereby reducing removal of the film. The gettering effect of phosphorus prevents alkaline impurities from entering the active region 102A, thereby improving the reliability of the semiconductor device.

In this embodiment, the third metal layer 163 has a smaller area than the first metal layer 161 and the second metal layer 162. This is because a thin wire is coupled to the third metal layer 163 since there is no need to apply a high voltage to a gate electrode. The third metal layer 163 is formed close to the first metal layer 161. This is because a higher voltage is applied to the second metal layer 162 which is a drain electrode pad. However, as long as a required breakdown voltage is obtained, the position of the third metal layer 163 is not particularly limited.

Where the minimum distances between the first metal layer 161 and the second metal layer 162, and between the third metal layer 163 and the second metal layer 162 are S1, the breakdown voltage of resin encapsulating the entire semiconductor device is A1, the product of S1 and A1 may be greater than the required breakdown voltage.

In order to secure a breakdown voltage, not only the distances between the metal layers which are electrode pads, but the distances between the first ohmic electrode interconnects 151 and the second ohmic electrode interconnects 152, the distances between the first ohmic electrode interconnects 151 and the second metal layer 162, and the distances between the second ohmic electrode interconnects 152 and the first metal layer 161 are important. Where the smallest one of the distances is S2, and the breakdown voltage of the second insulating film 142 is A2, the product of S2 and A2 may be greater than the required breakdown voltage. For example, the breakdown voltage of PBO is 250 V/μm. Thus, the smallest distance S1 may be 2.4 μm or greater where the required breakdown voltage is 600 V, and 4 μm or greater where the required breakdown voltage is 1000 V. In this embodiment, S1 is designed to be 5 μm.

In the semiconductor device according to this embodiment, an example has been described where back surface electrodes 164 made of for example, Au, tin (Sn), chrome (Cr), Ni, an alloy of these materials, etc., are formed on the surface of the substrate 101 opposite to the nitride semiconductor multilayer 102. The Back surface electrodes 164 are formed, thereby applying potential to the substrate 101 from the outside. The back surface electrodes 164 may be electrically coupled to the first ohmic electrodes 131. In this case, the back surface electrodes 164 may be source electrode pads. The back surface electrodes 164 may be coupled to the first ohmic electrodes 131 via through vias. The back surface electrodes 164 may be formed by, for example, sputtering or vapor deposition.

Figure 4:
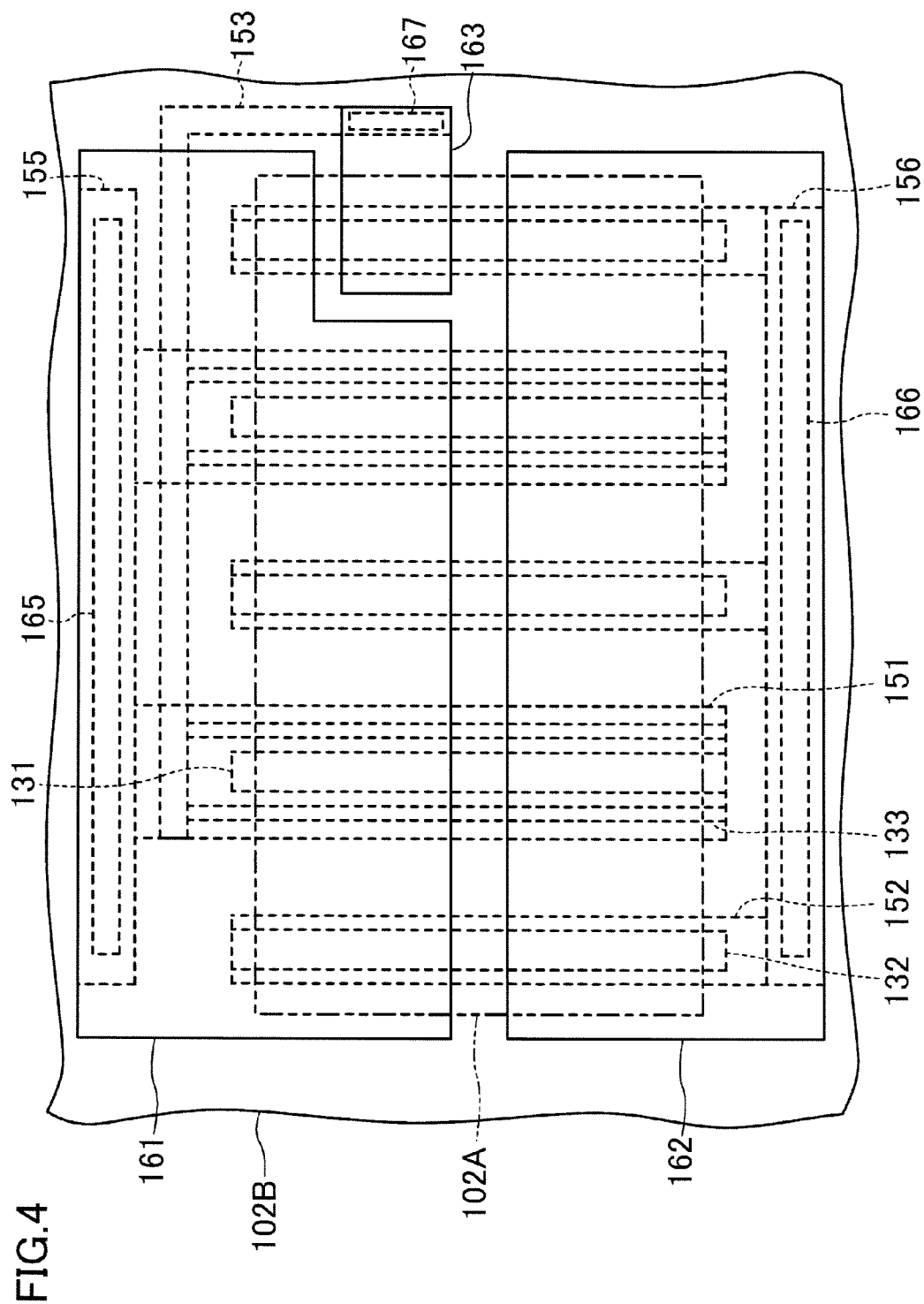
FIG. 4 is a top view of a nitride semiconductor device according to a variation of the embodiment.

In the semiconductor device according to this embodiment, a plurality of first vias 165 coupling the first metal layer 161 to the first ohmic electrode interconnects 151, are formed above the active region 102A. Second vias 166 coupling the second metal layer 162 to the second ohmic electrode interconnects 152 are similarly formed. This protects the active region from the stress occurring in wire bonding. However, the first vias 165 coupling the first metal layer 161 to the first ohmic electrode interconnects 151, and the second vias 166 coupling the second metal layer 162 to the second ohmic electrode interconnects 152 may be formed above the isolation region 102B. In this case, as shown in FIG. 4, an interconnect 155 coupling the first ohmic electrode interconnects 151 may be formed above the isolation region 102B, and the interconnect 155 may be coupled to the first metal layer 161 via the first vias 165. Also, the interconnect 156 coupling the second ohmic electrode interconnects 152 may be formed at the side opposite to the interconnect 155 relative to the active region 102A, and the interconnect 156 may be coupled to the second metal layer 162 via the second vias 166.

Figure 5:
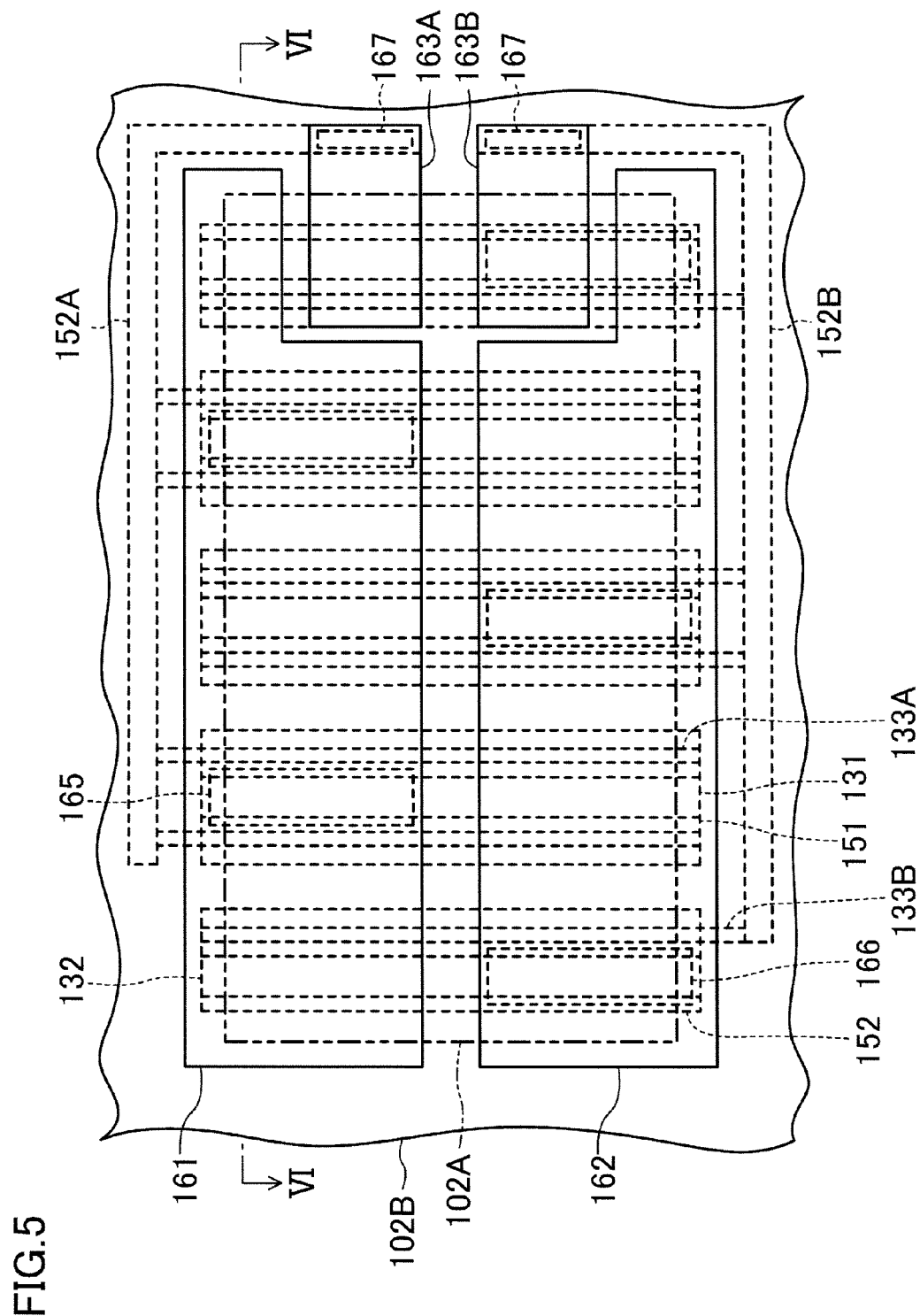
FIG. 5 is a top view of a nitride semiconductor device according to another variation of the embodiment.
Figure 6:
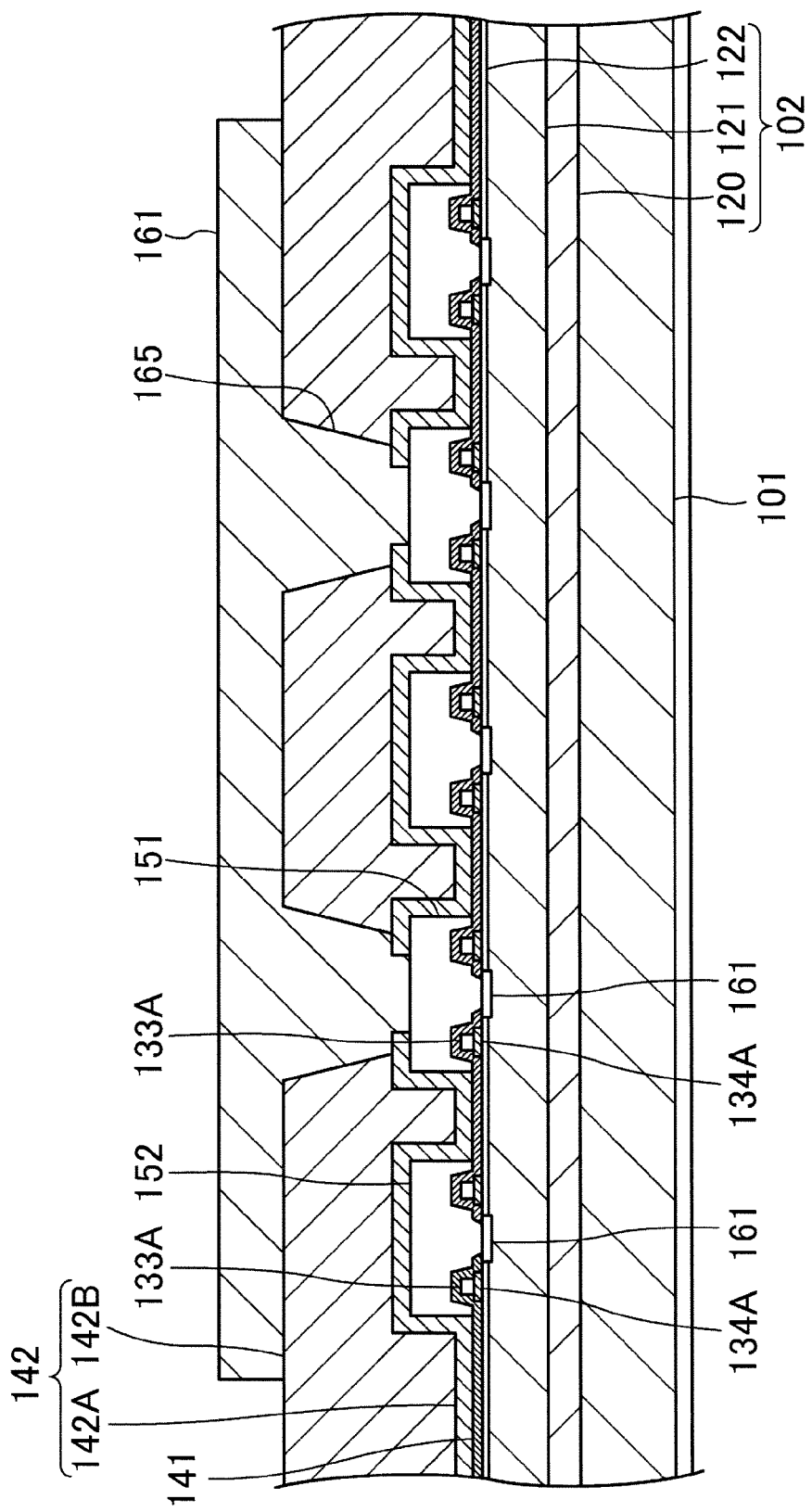
FIG. 6 is a cross-sectional view of the nitride semiconductor device according to the another variation.

While in this embodiment, the single-gate semiconductor device has been described as an example, a double-gate semiconductor device, which can be used for an inverter, a matrix converter, etc., may have a similar structure. FIGS. 5 and 6 illustrate an example double-gate semiconductor device. FIG. 5 is a top view. FIG. 6 is a cross-sectional view taken along the line VI-VI of FIG. 5.

In the double-gate semiconductor device, the first gate electrodes 133A and the second gate electrodes 133B are sequentially formed on the first ohmic electrodes 131 between each pair of the first ohmic electrodes 131 and the second ohmic electrodes 132. FIG. 6 illustrates an example where the first gate electrodes 133A and the second gate electrodes 133B are formed on the p-type third nitride semiconductor layer 134 so that the semiconductor device is of a normally-off type. Note that the semiconductor device may be of the normally-off type or a normally-on type, depending on a gate recess structure.

By applying a predetermined bias voltage to the first gate electrodes 133A and the second gate electrodes 133B, the gate electrodes can operate as bidirectional switches and diodes. For example, a voltage higher than or equal to the threshold voltage of the first gate electrodes 133A is applied to the first gate electrodes 133A using the potential of the first ohmic electrodes 131 as a reference, and a voltage higher than or equal to the threshold voltage of the second gate electrodes 133B is applied to the second gate electrodes 133B using the potential of the second ohmic electrodes 132 as a reference. This allows bidirectional conduction, in which currents bidirectionally flow between each pair of the first ohmic electrodes 131 and the second ohmic electrodes 132. On the other hand, a bias voltage applied to each of the first gate electrodes 133A and the second gate electrodes 133B is lower than or equal to the threshold voltage. This allows bidirectional cut-off, in which no current bidirectionally flows between each pair of the first ohmic electrodes 131 and the second ohmic electrodes 132.

A voltage higher than or equal to the threshold voltage is applied to the first gate electrodes 133A, and a voltage lower than or equal to the threshold voltage is applied to the second gate electrodes 133B. This allows diode operation, in which no current flows from the first ohmic electrodes 131 to the second ohmic electrodes 132, and currents flow from the second ohmic electrodes 132 to the first ohmic electrodes 131. A voltage lower than or equal to the threshold voltage is applied to the first gate electrodes 133A, and a voltage higher than or equal to the threshold voltage is applied to the second gate electrodes 133B. This allows diode operation, in which currents flow from the first ohmic electrodes 131 to the second ohmic electrodes 132, and no current flows from the second ohmic electrodes 132 to the first ohmic electrodes 131.

FIG. 5 illustrates an example where the first ohmic electrode interconnects 151 extends more than the first gate electrodes 133A toward the second gate electrodes 133B, and the second ohmic electrode interconnects 152 extends more than the second gate electrodes 133B toward the first gate electrodes 133A. This allows the first ohmic electrode interconnects 151 and the second ohmic electrode interconnects 152 to function as field plates. Part of the electric line of force between each pair of the first gate electrodes 133A and the second gate electrodes 133B can be cut off by the first ohmic electrode interconnects 151 and the second ohmic electrode interconnects 152. This reduces parasitic resistance Cgg between each pair of the first gate electrodes 133A and the second gate electrodes 133B, thereby reducing gate noise.

As shown in FIG. 5, a first gate electrode interconnect 152A coupling the first gate electrodes 133A, and a second gate electrode interconnect 152B coupling the second gate electrodes 133B are formed on opposite sides relative to the active region 102A, thereby easily forming the interconnects. A third metal layer 163A is preferably formed at the side of the first metal layer 161, and a fourth metal layer 163B is preferably formed at the side of the second metal layer 162.

Figure 7:
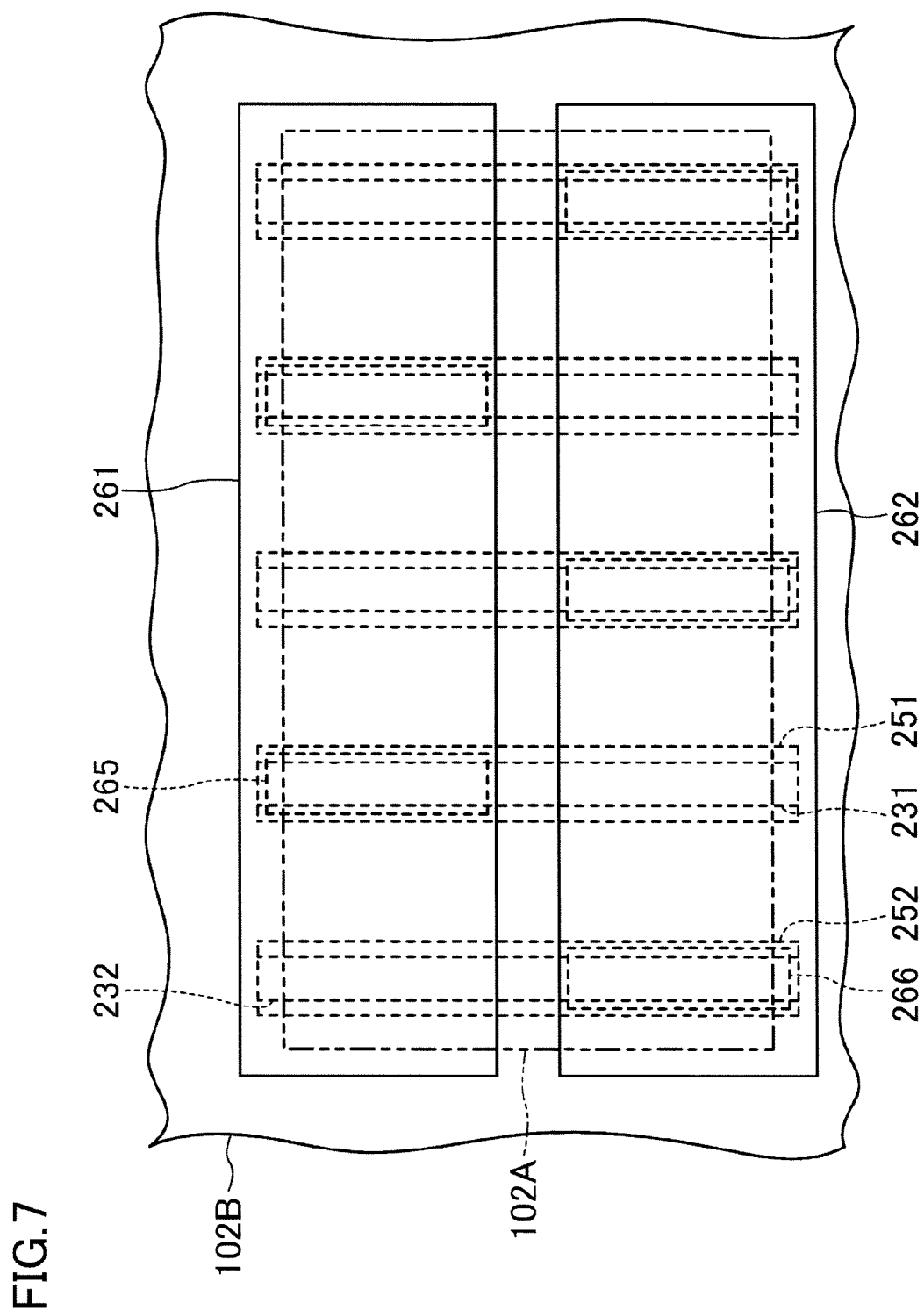
FIG. 7 is a top view of a nitride semiconductor device according to still another variation of the embodiment.

As shown in FIG. 7, a Schottky diode may have a similar structure. In this case, first electrodes 231 may be cathode electrodes which are in ohmic contact with a 2DEG layer, and second electrodes 232, are anode electrodes which are in Schottky contact with the 2DEG layer. The first electrodes 231 may be coupled to a first metal layer 261 via first electrode interconnects 251. The second electrodes 232 may be coupled to a second metal layer 262 via second electrode interconnects 252.

FIG. 7 illustrates an example where first vias 265 coupling the first metal layer 261 to the first electrode interconnects 251, and second vias 266 coupling the second metal layer 262 to the second electrode interconnects 252 are formed above an active region 102A. Instead, interconnects coupling the first electrode interconnects 251, and interconnects coupling the second electrode interconnects 252 may be formed in an isolation region 102B, and vias coupling the metal layers, which are electrode pads, to the interconnect may be formed above the isolation region 102B.

Each of the first electrodes 231 may be a multilayer of Ti and Ni, etc. Each of the second electrodes 232 may be an alloy of Pd and Au, etc.

The nitride semiconductor device according to the present disclosure solves the problems in forming electrode pads above on active layer, and reduces a rise in on-resistance, and is thus useful as a nitride semiconductor device including a power device etc. for a power supply circuit.

What is claimed is:

1. A nitride semiconductor device, comprising:
    a nitride semiconductor multilayer formed on a substrate, and including an active region surrounded by an isolation region;
    a first ohmic electrode and a second ohmic electrode, each having a finger-like structure and formed above the active region to be spaced apart from each other;
    a first insulating film covering the first and second ohmic electrodes, and having a first opening exposing an upper surface of the first ohmic electrode, and a second opening exposing an upper surface of the second ohmic electrode;
    a first electrode interconnect formed on the first ohmic electrode in contact with the first ohmic electrode in the first opening, and having a same longitudinal direction as the first ohmic electrode;
    a second electrode interconnect formed on the second ohmic electrode in contact with the second ohmic electrode in the second opening, and having a same longitudinal direction as the second ohmic electrode;
    a second insulating film covering the first and second electrode interconnects and having a first via exposing an upper surface of the first electrode interconnect; and
    a first metal layer formed above the active region with the second insulating film interposed therebetween, and coupled to the first electrode interconnect,
    wherein in a short direction of the first electrode interconnect, a width of the first ohmic electrode is smaller than a width of the first via at a lower end.

2. The nitride semiconductor device of claim 1, further comprising:
    a second metal layer formed above the second insulating film to be spaced apart from the first metal layer,
    wherein the second metal layer is formed above the active region, and coupled to the second electrode interconnect via a second via formed in the second insulating film and exposing an upper surface of the second electrode interconnect.

3. The nitride semiconductor device of claim 2, further comprising:
    the first via configured to couple the first metal layer to the first electrode interconnect; and
    the second via configured to couple the second metal layer to the second electrode interconnect,
    wherein the first and second vias are formed above the active region.

4. The nitride semiconductor device of claim 3, wherein the second insulating film includes:
    a first film being a silicon nitride film or a silicon oxide film, and
    a second film being an organic insulating film formed on the first film, and
    each of openings of the first and second vias has a larger area at a lower end of the second film than at an upper end of the first film, and
    in a short direction of the second electrode interconnect, a width of the second ohmic electrode is smaller than a width of the second via at a lower end.

5. The nitride semiconductor device of claim 2, further comprising:
    the first via configured to couple the first metal layer to the first electrode interconnect; and
    the second via configured to couple the second metal layer to the second electrode interconnect,
    wherein the first and second vias are formed above the isolation region.

6. The nitride semiconductor device of claim 5, wherein the second insulating film includes:
    a first film being a silicon nitride film or a silicon oxide film, and
    a second film being an organic insulating film formed on the first film, and
    each of openings of the first and second vias has a larger area at a lower end of the second film than at an upper end of the first film, and
    in a short direction of the second electrode interconnect, a width of the second ohmic electrode is smaller than a width of the second via at a lower end.

7. The nitride semiconductor device of claim 2, wherein a product of a breakdown voltage of the second insulating film and the shortest one of a minimum distance between the first and second electrode interconnects, a minimum distance between the first electrode interconnect and the second metal layer, or a minimum distance between the second electrode interconnect and first metal layer is 600 V or higher.

8. The nitride semiconductor device of claim 2, wherein
the first ohmic electrode is a cathode electrode, and
the second ohmic electrode is an anode electrode.

9. The nitride semiconductor device of claim 2, further comprising:
a first gate electrode having a finger-like structure, and formed between the first and second ohmic electrodes; and
a third metal layer formed on the second insulating film to be spaced apart from the first and second metal layers, and coupled to the first gate electrode,
wherein a distance between the third and second metal layers is greater than or equal to a distance between the third and first metal layers,
the first ohmic electrode is a source electrode, and
the second ohmic electrode is a drain electrode.

10. The nitride semiconductor device of claim 9, wherein
in a cross-section perpendicular to the substrate, and perpendicularly crossing in the short direction of the first and second electrode interconnects,
an end of the first electrode interconnect close to the second ohmic electrode is located closer to the second electrode than the first gate electrode,
the first gate electrode includes a plurality of first gate electrodes, and
two of the plurality of first gate electrodes are included within a width of the first electrode interconnect.

11. The nitride semiconductor device of claim 9, further comprising a p-type nitride semiconductor layer formed between the first gate electrode and the nitride semiconductor multilayer.

12. The nitride semiconductor device of claim 2, further comprising:
a first gate electrode and a second gate electrode, each having a finger-like structure and sequentially formed above the first ohmic electrode between the first and second ohmic electrodes; and
a third metal layer and a fourth metal layer formed on the second insulating film to be spaced apart from the first and second metal layers, and coupled to the first and second gate electrodes, respectively,
wherein a distance between the third and second metal layers is greater than or equal to a distance between the third and first metal layers.

13. The nitride semiconductor device of claim 12, wherein
in a cross-section perpendicular to the substrate, and perpendicularly crossing in the short direction of the first and second electrode interconnects,
an end of the first electrode interconnect close to the second ohmic electrode is located closer to the second ohmic electrode than the first gate electrode, and closer to the first gate electrode than the second gate electrode,
the first gate electrode includes a plurality of first gate electrodes,
two of the plurality of first gate electrodes are included within a width of the first electrode interconnect,
an end of the second electrode interconnect close to the first ohmic electrode is located closer to the first ohmic electrode than the second gate electrode, and closer to the second gate electrode than the first gate electrode,
the second gate electrode includes a plurality of second gate electrodes, and
two of the plurality of second gate electrodes are included within a width of the second electrode interconnect.

14. The nitride semiconductor device of claim 12, further comprising a p-type nitride semiconductor layer formed between the first and second gate electrodes and the nitride semiconductor multilayer.

* * * * *